US006855942B2

(12) United States Patent
Bechthold et al.

(10) Patent No.: US 6,855,942 B2
(45) Date of Patent: Feb. 15, 2005

(54) APPARATUS FOR PRE-ACCELERATION OF ION BEAMS USED IN A HEAVY ION BEAM APPLICATIONS SYSTEM

(75) Inventors: Alexander Bechthold, Darmstadt (DE); Ulrich Ratzinger, Darmstadt (DE); Alwin Schempp, Darmstadt (DE); Bernhard Schlitt, Darmstadt (DE)

(73) Assignee: Gesellschaft fuer Schwerionenforschung mbH, Darmstadt (DE)

( * ) Notice: Subject to any disclaimer, the term of this patent is extended or adjusted under 35 U.S.C. 154(b) by 0 days.

(21) Appl. No.: 10/470,445

(22) PCT Filed: Feb. 5, 2002

(86) PCT No.: PCT/EP02/01166

§ 371 (c)(1),
(2), (4) Date: Dec. 9, 2003

(87) PCT Pub. No.: WO02/063933

PCT Pub. Date: Aug. 15, 2002

(65) Prior Publication Data

US 2004/0084634 A1 May 6, 2004

(30) Foreign Application Priority Data

Feb. 5, 2001 (EP) ........................................... 01102192
Feb. 5, 2001 (EP) ........................................... 01102194

(51) Int. Cl.[7] .......................... G21G 5/00; H01J 37/08; H01J 25/10; H05H 7/00; H05H 9/00

(52) U.S. Cl. .................. 250/492.3; 315/5.39; 315/5.29; 315/5.41; 315/501; 315/505; 250/492.21

(58) Field of Search ......................... 250/492.3, 492.21; 315/5.39, 5.29, 5.41, 501, 505

(56) References Cited

U.S. PATENT DOCUMENTS

| | | | | | |
|---|---|---|---|---|---|
| 4,870,287 | A | | 9/1989 | Cole et al. | |
| 5,334,943 | A | * | 8/1994 | Sawada | 315/505 |
| 5,422,549 | A | * | 6/1995 | Shepard et al. | 315/505 |
| 5,430,359 | A | * | 7/1995 | Swenson et al. | 315/501 |
| 5,789,865 | A | * | 8/1998 | Yu et al. | 315/5.39 |
| 5,796,219 | A | * | 8/1998 | Hirakimoto et al. | 315/500 |
| 6,493,424 | B2 | * | 12/2002 | Whitham | 378/137 |

OTHER PUBLICATIONS

Yuan V W et al: "Unexpected matching insensitivity in DTL of GTA accelerator" *Proceedings of the 1995 Particle Accelerator Conference* (*Cat. No. 95CH35843*), *Proceedings Particle Accelerator Conference, Dallas, TX, USA*, May 1–5, 1995, pp. 1167–1169.

Ratzinger U et al.: "A new matcher type between RFQ and IH–DTL for the GSI high current heavy ion prestripper linac" *Proceedings of the XVIII International Linear Accelerator Conference, Proceedings of 18$^{th}$ International Linac Conference* (*Linac 96*), *Geneva, Switzerland, CERN, Switzerland*, pp. 128, 130.

(List continued on next page.)

*Primary Examiner*—John R. Lee
*Assistant Examiner*—Kalimah Fernandez
(74) *Attorney, Agent, or Firm*—Frommer Lawrence & Haug LLP; Ronald R. Santucci

(57) ABSTRACT

The present invention relates to an apparatus for pre-acceleration of ions and optimized matching of beam parameters used in a heavy ion application comprising a radio frequency quadruple accelerator (RFQ) having two mini-vane pairs supported by a plurality of alternating stems accelerating the ions from about 8 keV/u to about 400 keV/u and an intertank matching section for matching the parameters of the ion beam coming from the radio frequency quadruple accelerator (RFQ) to the parameters required by a subsequent drift tube linear accelerator (DTL).

16 Claims, 10 Drawing Sheets

OTHER PUBLICATIONS

Chidley B G et al.: "A heavy ion RFQ with high accelerating gradient" *1986 Linear Accelerator Conference Proceedings* (*SLAC–303*), *Stanford, CA, USA*, Jun. 2–6, 1986, pp. 361–363.

Billen J H et al.: "Smooth transverse and longitudinal focusing in high–intensity ion linacs" *Proceedings of the XVIII International Linear Accelerator Conference, Proceedings of 18^th^ International Linac Conference* (*Linac 96*), *Geneva, Switerland*, Aug. 26–30, 1996, pp. 587–591.

Wolf B H et al.: "Heavy ion injector for the CERN Linac 1" *Nuclear Instruments & Methods in Physics Research, Section A* (*Accelerators, Spectrometers, Detectors and Associated Equipment*), *Jul. 15, 1987, The Netherlands*, vol. A258, No. 1, pp. 1–8.

Bechtold A et al.: "Design studies of an RFQ–injector for a medicine–synchrotron" *PACS2001 Proceedings of the 2001 Particle Accelerator Conference* (*CAT. No. 01CH37268*), *Proceedings of 2001 Particle Accelerator Conference, Chicago, Illinois, USA* Jun. 18–22, 2001, pp. 2485–2487.

* cited by examiner

Fig. 10
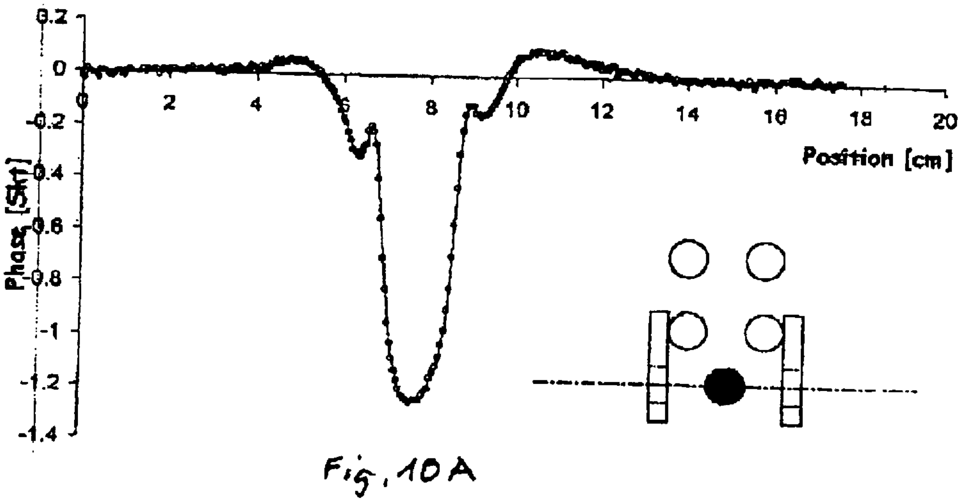
Fig. 10A
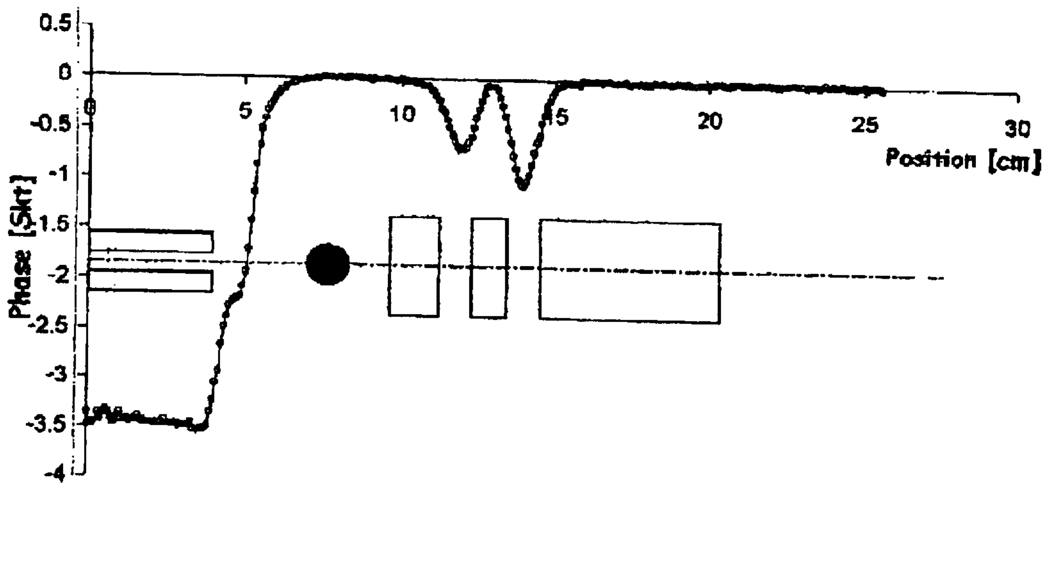
Fig. 10 B

APPARATUS FOR PRE-ACCELERATION OF ION BEAMS USED IN A HEAVY ION BEAM APPLICATIONS SYSTEM

This application is a 371 of PCT/EP02/01166 filed on Feb. 5, 2002, published on Aug. 15, 2002 under publication number WO 02/063933 A1 which claims priority benefits from European patent application number EP 01 102 192.0 filed Feb. 5, 2001 and European patent application number EP 01 102 194.6 filed Feb. 5, 2001.

The present invention relates to an apparatus for pre-acceleration of ion beams and optimized matching of beam parameters used in a heavy ion beam application system according to the preamble of independent claims.

From U.S. Pat. No. 4,870,287 a proton beam application system is known for selectively generating and transporting proton beams from a single proton source. The disadvantage of such a system is, that the flexibility to treat patients is quite limited to relatively low effective proton beams.

It is an object of the present invention to provide an improved apparatus for pre-acceleration of ion beams and optimized matching of beam parameters used in a heavy ion beam application system.

This object is achieved by the subject matter of independent claims. Features of preferred embodiments are defined by dependent claims.

According to the invention an apparatus is provided for pre-acceleration of ion beams and optimized matching of beam parameters used in a heavy ion beam application system comprising a radio frequency quadrupole accelerator having two mini-vane pairs supported by a plurality of alternating stems accelerating the ions from about 8 keV/u to about 400 keV/u and an intertank matching section for matching the parameters of the ion beams coming from the radio frequency quadrupole accelerator to the parameters required by a subsequent drift tube linear accelerator.

For matching the transverse as well as the longitudinal output beam parameters of a Radio Frequency Quadrupole accelerator (RFQ) to the values required at injection into a subsequent Drift Tube Linac (DTL)—wherein linac is an abbreviation for linear accelerator—a very compact scheme is proposed in order to simplify the operation and to increase the reliability of the system as well as to safe investment and running costs.

In the present invention the radio frequency quadrupole has an increased aperture towards the end of its structure. This has the advantage that the transverse focusing strength towards the end of the RFQ is reduced and that a maximum beam angle of about 20 mrad or less is achieved at the exit of the RFQ. This allows a very smooth transverse focusing along the intertank matching section and an optimized matching to a subsequent IH-type DTL (IH-DTL) in the transverse phase planes. This has the advantage of a minimized growth of the beam emittance during the acceleration along the IH-DTL and, hence, minimized beam losses. A further advantage of a very smooth focusing along the intertank matching section is that a minimum number of focusing elements is sufficient along that section.

In a preferred embodiment of the present invention two rebunching drift tubes are positioned at the exit of said radio frequency quadrupole and are integrated into the RFQ tank for matching of the beam parameters in the longitudinal phase plane. A well-defined phase width of less than ±15 degree at the entrance of the drift tube linac and a longitudinally convergent beam at injection into the first accelerating section of the IH-DTL are achieved in this way. This embodiment has the advantage that no additional bunching cavity must be installed in the intertank matching section to achieve a sufficient longitudinal focusing. Due to the advantages of the present invention such an additional bunching cavity as well as the additional rf equipment required for operating such a cavity can be safed, increasing the reliability of the whole system as well as leading to an easier operation.

In a further preferred embodiment of the present invention said RFQ has a synchronous phase increasing towards 0 degree towards the end of the structure. This has the advantage that the drift space in front of said two rebunching drift tubes integrated into the RFQ tank can be minimized and that the effect of said rebunching gaps can be optimized.

In a further preferred embodiment of the present invention the radio frequency quadrupole is operated at the same frequency as downstream positioned drift tube linac, wherein linac is an abbreviation for linear accelerator. This has the advantage that no frequency adaptation means are necessary.

In a further embodiment of the present invention the intertank matching section comprises an xy-steerer magnet downstream of said radiofrequency quadrupole and a quadrupole doublet positioned downstream of said xy-steerer. This has the advantage that it allows a matching in the transverse phase planes with a minimum number of additional elements.

In a further preferred embodiments of the present invention the intertank matching section comprises a diagnostic chamber enclosing a capacitive phase probe and/or a beam transformer positioned at the end of the intertank matching section. These diagnostic means have the advantage that they can measure the beam current and a shape of the beam pulses, respectively, during operation of the system without disturbing the beam. Therefore, these diagnostic means are very effective to control in situ the beam current and pulse shape, respectively.

The invention is now explained with respect to embodiments according to subsequent drawings.

FIG. 10 shows results of bead-pertubation measurements using said model of FIG. 9.

Figure 1:
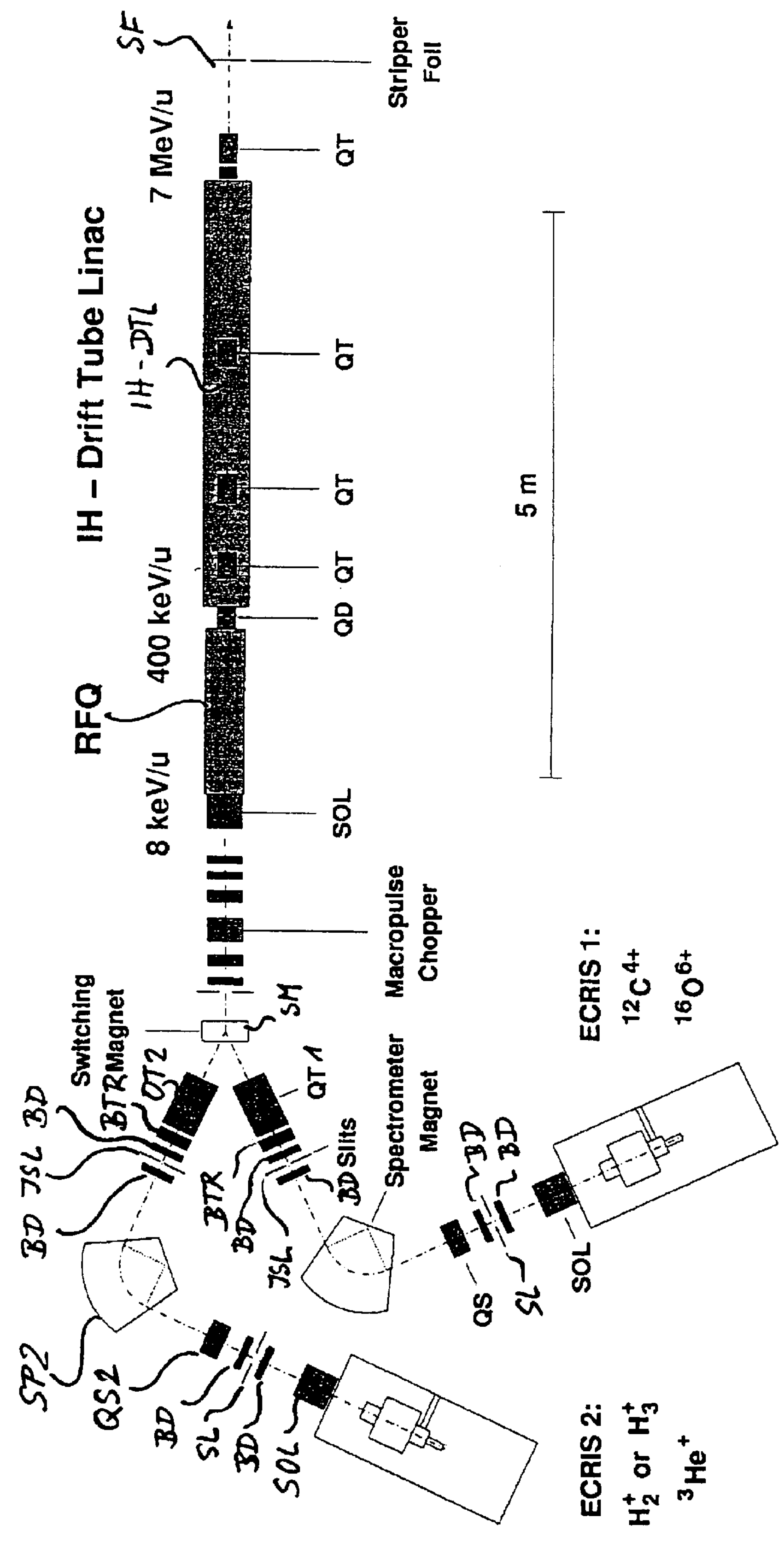
FIG. 1 shows a schematic drawing of a complete injector linac for an ion beam application system containing an apparatus for and pre-acceleration of heavy ion beams and optimized matching of beam parameters.
Figure 2:
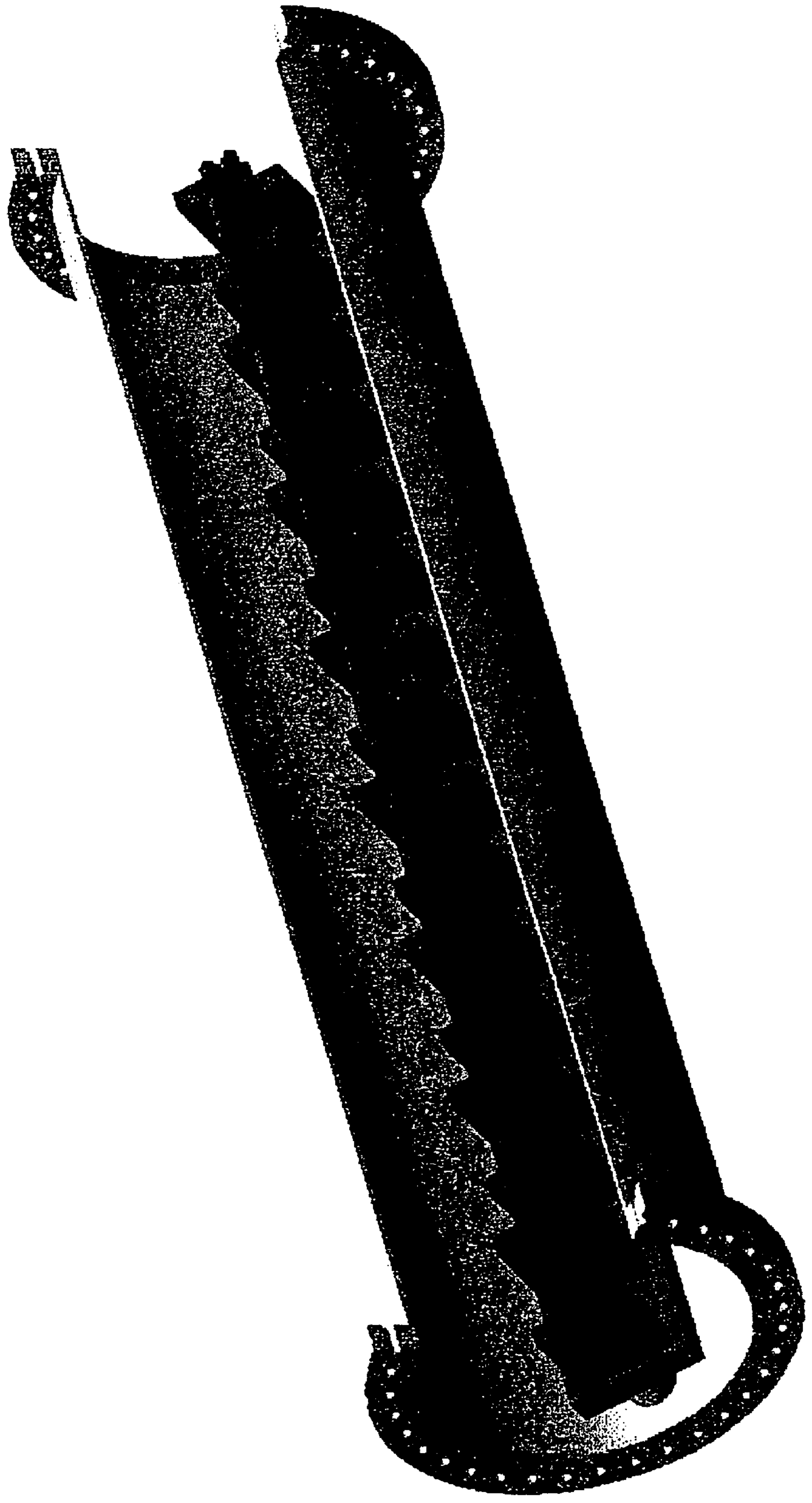
FIG. 2 shows a schematic view of the structure of the radio frequency quadrupole.
Figure 4:
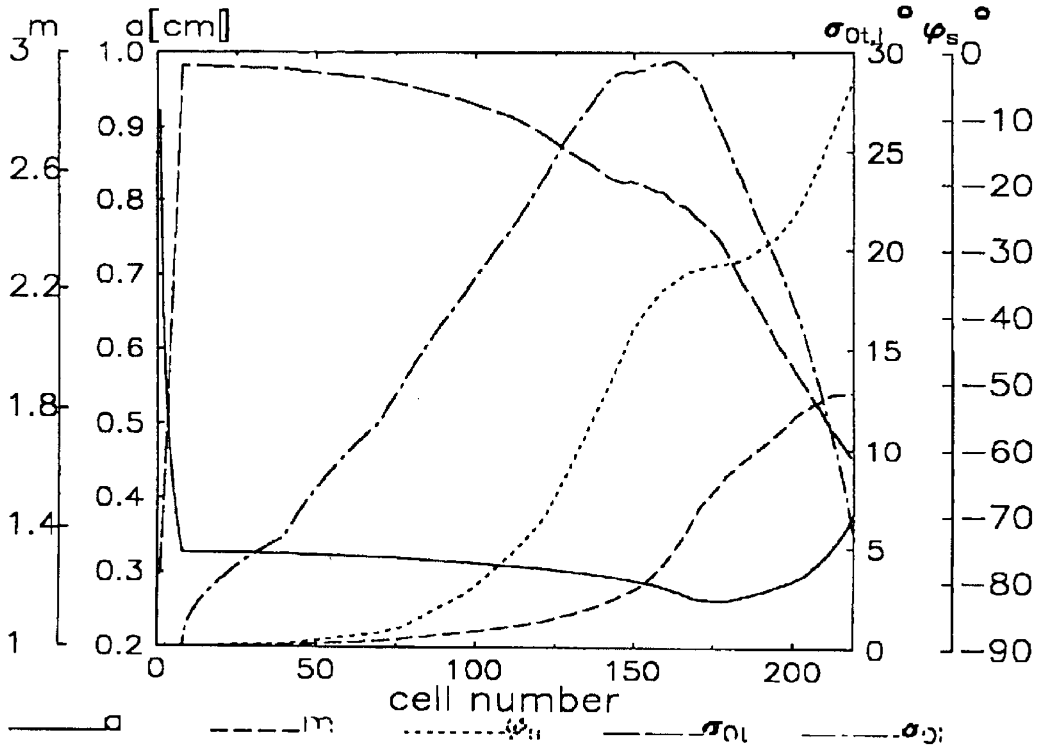
FIG. 4 shows further examples for beam envelops in a low energy beam transport system.

The reference signs within FIGS. 1, 2 and 4 are defined as follows:

| | |
|---|---|
| ECRIS1 | First electron cyclotron resonance ion sources for heavy ions like $^{12}C^{4+}$, $^{16}C^{6+}$ |
| ECRIS2 | Second electron cyclotron resonance ion sources for light ions like $H_2^+$, $H_3^+$ or $^3He^+$ |
| SOL | Solenoid magnet at the exit of ECRIS1 and ECRIS2 and at the entrance of a radio frequency quadrupole (RFQ) |
| BD | Beam diagnostic block comprising profile grids and/or Faradays cups and/or a beam transformer and/or a capacitive phase probe |
| SL | slit |
| QS1 | Magnetic quadrupole singlet of first branch |
| QS2 | Magnetic quadrupole singlet of second branch |
| QD | Magnetic quadrupole douplet |
| QT | Magnetic quadrupole triplet |
| SP1 | Spectrometer magnet of first branch |
| SP2 | Spectrometer magnet of second branch |
| SM | Switching magnet |
| CH | Macropulse chopper |
| RFQ | Radio-frequency quadrupole accelerator |
| IH-DTL | IH-type drift tube linac |
| SF | Stripper foil |
| EL | Electrodes of the RFQ structure |
| ST | Support stems carrying the electrodes of the RFQ structure |
| BP | Base plate of the RFQ structure |
| a) (FIG. 4) | aperture radius |
| b) (FIG. 4) | modulation parameter |
| c) (FIG. 4) | synchronous phase |
| d) (FIG. 4) | zero current phase advance in transverse direction |
| e) (FIG. 4) | zero current phase advance in longitudinal direction |

FIG. 1 shows a schematic drawing of a complete injector linac for an ion beam application system containing an apparatus for and pre-acceleration of heavy ion beams and optimized matching of beam parameters. The tasks of the different sections of FIG. 1 containing said apparatus for pre-acceleration of heavy ion beams and optimized matching of beam parameters and the corresponding components can be summarized in the following items:

1. The production of ions, pre-acceleration of the ions to a kinetic energy of 8 keV/u and formation of ion beams with sufficient beam qualities are performed in two independent ion sources and the ion source extraction systems. For routine operation, one of the ion sources should deliver a high-LET ion species ($^{12}C^{4+}$ and $^{16}O^{6+}$, respectively), whereas the other ion source will produce low-LET ion beams ($H_2^+$, $H_3^+$ or $^3He^{1+}$).

2. The charge states to be used for acceleration in the injector linac are separated in two independent spectrometer lines. Switching between the selected ion species from the two ion source branches, beam intensity control (required for the intensity controlled raster-scan method), matching of the beam parameters to the requirements of the subsequent linear accelerator and the definition of the length of the beam pulse accelerated in the linac are done in the low-energy beam transport (LEBT) line.

3. The linear accelerator consists of a short radio-frequency quadrupole accelerator (RFQ) of about 1.4 m in length, which accelerates the ions from 8 keV/u to 400 keV/u and which main parameters are shown in Table 1.

TABLE 1

| Design Ion | $^{12}C^{4+}$ |
|---|---|
| Injection energy | 8 ke V/u |
| Final energy | 400 ke V/u |

TABLE 1-continued

| Design Ion | $^{12}C^{4+}$ |
|---|---|
| Components | one tank, 4-rod like structure |
| Mini-vane length | ≈1.28 m |
| Tank length | ≈1.39 m |
| Innertank diameter | ≈0.25 m |
| Operating frequency | 216.816 MHz |
| RF peak power | ≈100 kW |
| RF pulse length | 500 μs, f 10 Hz |
| Electrode peak voltage | 70 kV |
| Period length | 2.9–20 mm |
| Min. aperture radius $a_{min}$ | 2.7 mm |
| Acceptance, transv., norm. | ≈1.3 mm rad |
| Transmission | ≧90% |

Table 1: Main Parameters of the RFQ

The linear accelerator consists further of a compact beam matching section of about 0.25 m in length and a 3.8 m long IH-type drift tube linac (IH-DTL) for effective acceleration to the linac end energy of 7 MeV/u.

4. Remaining electrons are stripped off in a thin stripper foil located about 1 m behind of the IH-DTL to produce the highest possible charge states before injection into the synchrotron in order to optimize the acceleration efficiency of the synchrotron (Table 2).

Table 2 shows charge states of all proposed ion species for acceleration in the injector linac (left column) and behind of the stripper foil (right column)

TABLE 2

| Ions from source | Ions to synchrotron |
|---|---|
| $^{16}O^{6+}$ | $^{16}O^{8+}$ |
| $^{12}C^{4+}$ | $^{12}C^{6+}$ |
| $^3He^{1+}$ | $^3He^{2+}$ |
| $^1H_2^+$ or $^1H_3^+$ | protons |

The design of the injector system comprising the present invention has the advantage to solve the special problems on a medical machine installed in a hospital environment, which are high reliability as well as stable and reproducible beam parameters. Additionally, compactness, reduced operating and maintenance requirements. Further advantages are low investment and running costs of the apparatus.

Both the RFQ and the IH-DTL are designed for ion mass-to-charge ratios A/q≦3 (design ion $^{12}C^{4+}$) and an operating frequency of 216.816 MHz. This comparatively high frequency allows to use a quite compact LINAC design and, hence, to reduce the number of independent cavities and rf power transmitters. The total length of the injector, including the ion sources and the stripper foil, is around 13 m. Because the beam pulses required from the synchrotron are rather short at low repetition rate, a very small rf duty cycle of about 0.5% is sufficient and has the advantage to reduce the cooling requirements very much. Hence, both the electrodes of the 4-rod-like RFQ structure as well as the drift tubes within the IH-DTL need no direct cooling (only the ground plate of the RFQ structure and the girders of the IH structure are water cooled), reducing the construction costs significantly and improving the reliability of the system.

FIG. 2 shows a schematic view of the structure of the radio frequency quadrupole (RFQ).

A compact four-rod like RFQ accelerator equipped with mini-vane like electrodes of about 1.3 m in length is designed for acceleration from 8 keV/u to 400 keV/u (table 1). The resonator consists of four electrodes arranged as a quadrupole. Diagonally opposite electrodes are connected by 16 support stems which are mounted on a common base plate.

Each stem is connected to two opposite mini-vanes. The rf quadrupole field between the electrodes is achieved by a $\lambda/2$ resonance which results from the electrodes acting as capacitance and the stems acting as inductivity. The complete structure is installed in a cylindrical tank with an inner diameter of about 0.25 m. Because the electrode pairs lie in the horizontal and vertical planes, respectively, the complete structure is mounted under 45° with respect to these planes.

The structure is operated at the same rf frequency of 216.816 MHz as applied to the IH-DTL. The electrode voltage is 70 kV and the required rf peak power amounts to roughly 100 kW. The rf pulse length of about 500 $\mu$s at a pulse repetition rate of 10 Hz corresponds to a small rf duty cycle of 0.5%. Hence, no direct cooling is needed for the electrodes and only the base plate is water cooled.

Figure 3:
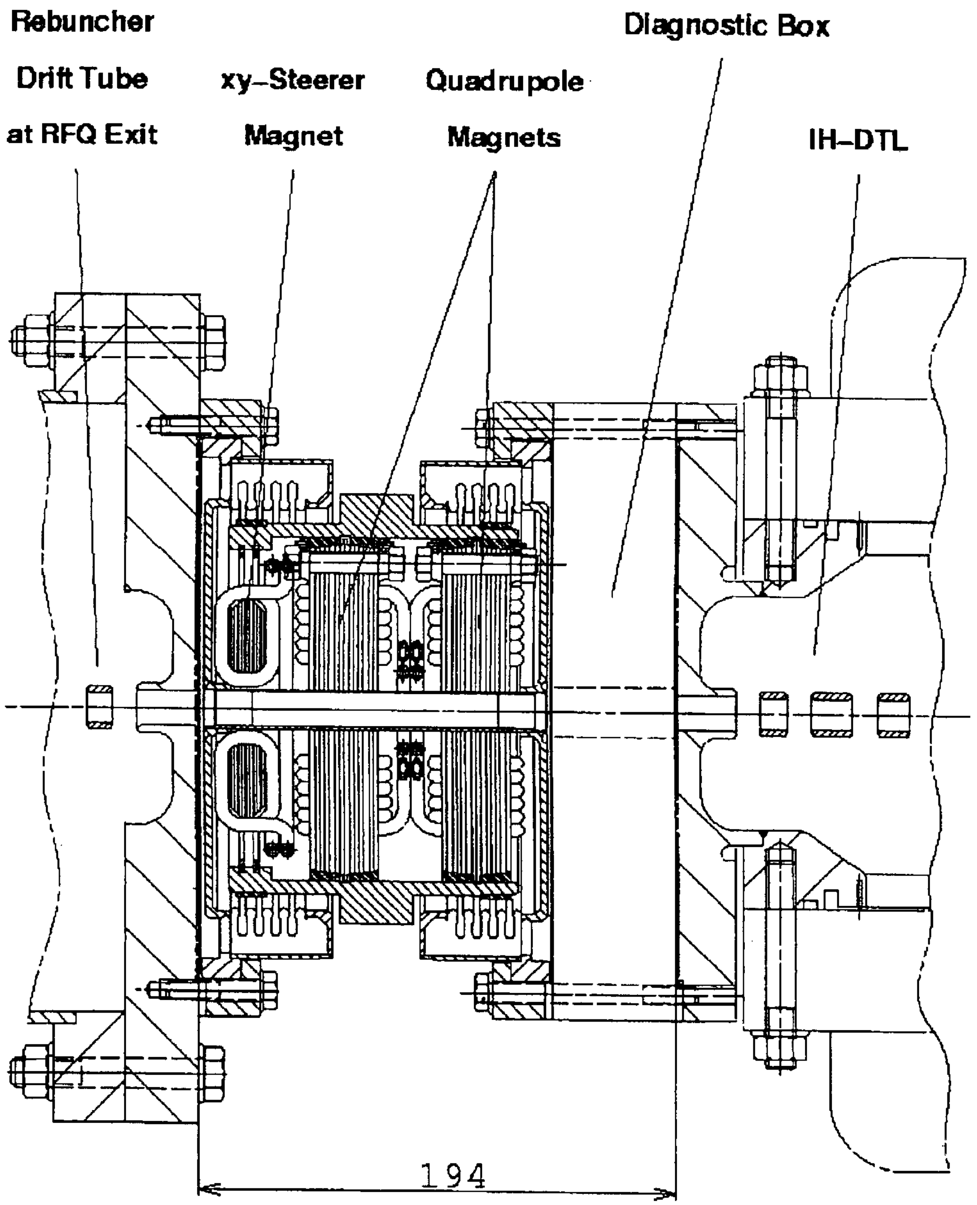
FIG. 3 shows a schematic drawing of a complete intertank matching section.

FIG. 3 shows a schematic drawing of a complete intertank matching section.

For matching the transverse as well as the longitudinal output beam parameters of the RFQ to the values required at injection into the IH-DTL a very compact scheme is provided in order to simplify the operation and to increase the reliability of the machine.

Although both the RFQ as well as the IH-DTL are operated at the same frequency, longitudinal bunching is required to ensure a well defined phase width of less than ±15° at the entrance of the DTL and to achieve a longitudinally convergent beam at injection into the first $\phi_S$=0° section within the DTL. For that purpose the integration of two drift tubes at the high-energy end of the RFO resonator is provided, which is supported by an additional IH-internal $\phi_S$=−35° rebuncher section consisting of the first two gaps of the IH-DTL.

Regarding transverse beam dynamics, the RFQ and the IH-DTL have different focusing structures. Whereas along the RFQ a FODO lattice with a focusing period of $\beta\lambda$ is applied, a triplet-drift-triplet focusing scheme with focusing periods of at least 8 $\beta\lambda$ is applied along the IH-DTL. At the exit of the RFQ electrodes, the beam is convergent in one transverse direction and divergent in the other direction, whereas a beam focused in both transverse directions is required at the entrance of the IH-DTL. To perform this transverse matching, a short magnetic quadrupole doublet with an effective length of 49 mm of each of the quadrupole magnets is sufficient, which will be placed within said intertank matching section of FIG. 3 in between the RFQ and the IH tanks. Furthermore, a small xy-steerer is mounted in the same chamber of said intertank matching section directly in front of the quadrupole douplet magnets. This magnetic unit is followed by a short diagnostic chamber of about 50 mm in length, consisting of a capacitive phase probe and a beam transformer. The mechanical length between the exit flange of the RFQ and the entrance flange of the IH-DTL is about 25 cm.

The design of the intertank matching section determines also the final energy of the RFQ: based on the given mechanical length of the matching section, the end energy of the RFQ is chosen in a way that the required beam parameters at the entrance of the IH-DTL can be provided. If the energy of the ions is too small, a pronounced longitudinal focus, i.e. a waist in the phase width of the beam, appears in between the RFQ and the IH-DTL. The position of the focus is the closer to the RFQ, the smaller the beam energy is. Hence, for a given design of the RFQ and the subsequent rebuncher scheme, the phase width at the entrance of the IH-DTL increases with decreasing RFQ end energy. But if the phase width at the entrance of the IH-DTL becomes too large, significant growth of the longitudinal as well as the transverse beam emittances occurs along the DTL, which is avoided by the present invention. Finally, after detailed beam dynamics simulation studies along the RFQ, the intertank section and the IH-DTL, an RFQ end energy of 400 keV/u has been chosen, as this energy provides the required beam parameters at the entrance of the IH-DTL, and it allows a quite compact RFQ design with moderate rf power consumption.

FIG. 4 shows the radio frequency quadrupole (RFQ) structure parameters along the RFQ. The different structure parameters are plotted versus the cell number of the RFQ accelerating structure.

Curve a) shows the aperture radius of the structure. The aperture of the RFQ radius is about 3±0.3 mm along most parts of the structure, which is comparable to the cell length at the beginning of $\beta\lambda/2\approx2.9$ mm. The aperture radius is enlarged strongly in the short radial matching section consisting of the first few RFQ cells towards the beginning of the structure in order to increase the acceptance towards higher beam radii.

The aperture of the RFQ is increased also towards the end of the structure leading to a decreasing focusing strength which guarantees a maximum beam angle of 20 mrad at the exit of the RFQ. This improvement of the present invention has the advantage to allow a very short matching section for matching of the transverse beam parameters provided by the RFQ to the parameters required by the subsequent IH-DTL and to achieve an optimized matching, minimizing the emittance growth of the beam along the IH-DTL.

Curve b) shows the modulation parameter which is small at the beginning of the structure for optimized beam shaping, pre-bunching and bunching of the beam and increases towards its end for efficient acceleration.

Curve c) shows the synchronous phase. The synchronous phase is close to −90 degree at the beginning of the structure for optimized beam shaping, pre-bunching and bunching of the beam. It increases slightly while accelerating the beam to higher energies. The synchronous phase is increasing towards 0 degree towards the end of the structure in order to provide a longitudinal drift in front of the rebunching gaps following directly the RFQ electrodes. This advantage of the present invention enhances the efficiency of said rebunching gaps and is necessary to achieve the small phase width of ±15 degree required at the entrance of the IH-DTL.

FIG. 5A to FIG. 5D show transverse phase space projections of the particle distribution at the beginning of the RFQ electrodes together with transverse acceptance plots of the RFQ.

FIG. 5A shows the acceptance area of the RFQ in the horizontal phase plane as resulting from simulations.

FIG. 5B shows the projection of the particle distribution at RFQ injection in the horizontal phase plane as used as input distribution for the beam dynamics simulations.

FIG. 5C shows the acceptance area of the RFQ in the vertical phase plane as resulting from simulations.

FIG. 5D shows the projection of the particle distribution at RFQ injection in the vertical phase plane as used as input distribution for the beam dynamics simulations.

Extensive particle dynamics simulations have been performed to optimize the RFQ structure and to achieve an optimized matching to the IH-DTL. Transverse phase space projections of the particle distribution used at the entrance of the RFQ are shown in parts B and D of FIG. 5, respectively. The normalized beam emittance is about 0.6 $\pi$ mm mrad in both transverse phase planes which is adapted to values measured for the ion sources to be used.

Figure 5:
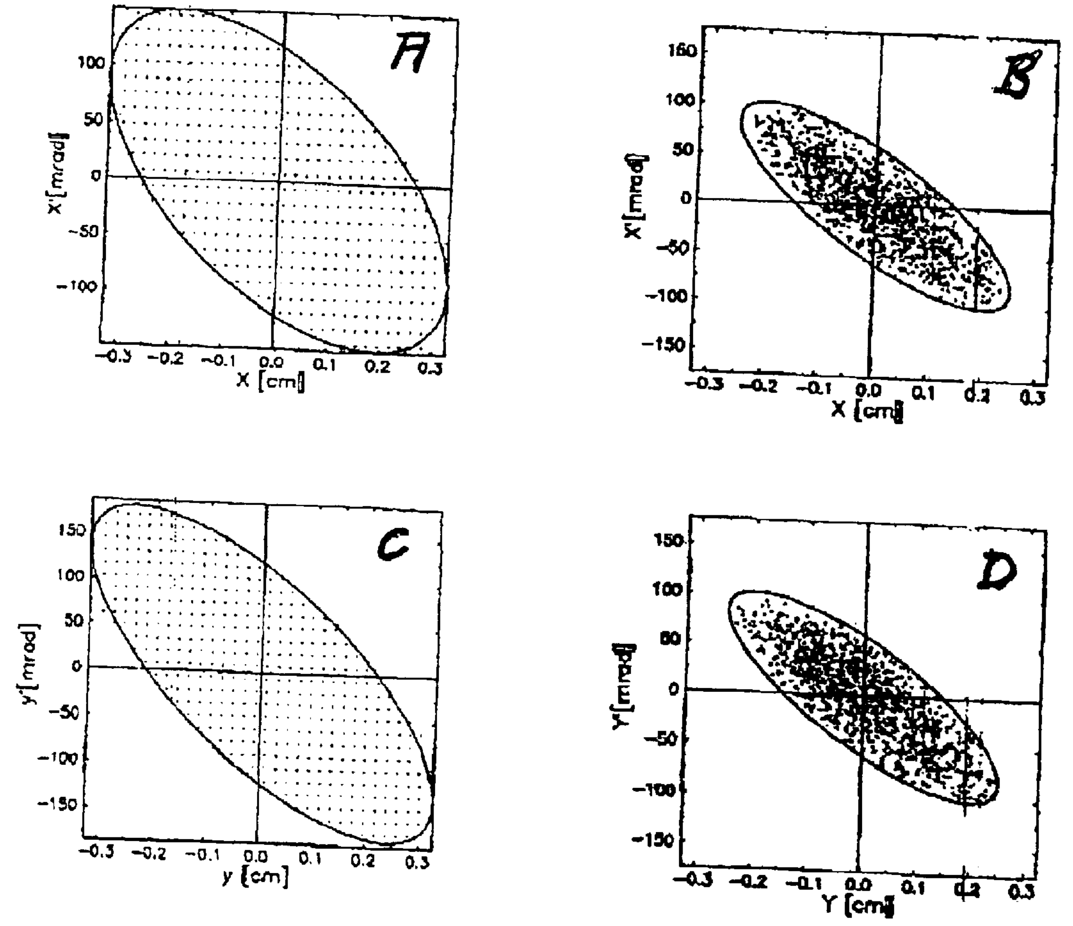
FIG. 5 shows the radio frequency quadrupole (RFQ) structure parameters along the RFQ.

The transverse acceptance areas of the RFQ resulting from the simulations using the structure parameters as shown in FIG. 4 are shown in parts A and C of FIG. 5, respectively. They are significantly larger than the injected beam emittances providing a high transmission of the RFQ of at least 90%. The normalized acceptance amounts to about 1.3 π mm mrad in each transverse phase planes. The maximum acceptable beam radii are about 3 mm.

FIG. 6A to FIG. 6D show phase space projections of the particle distribution at the end of the RFQ electrodes.

Figure 6:
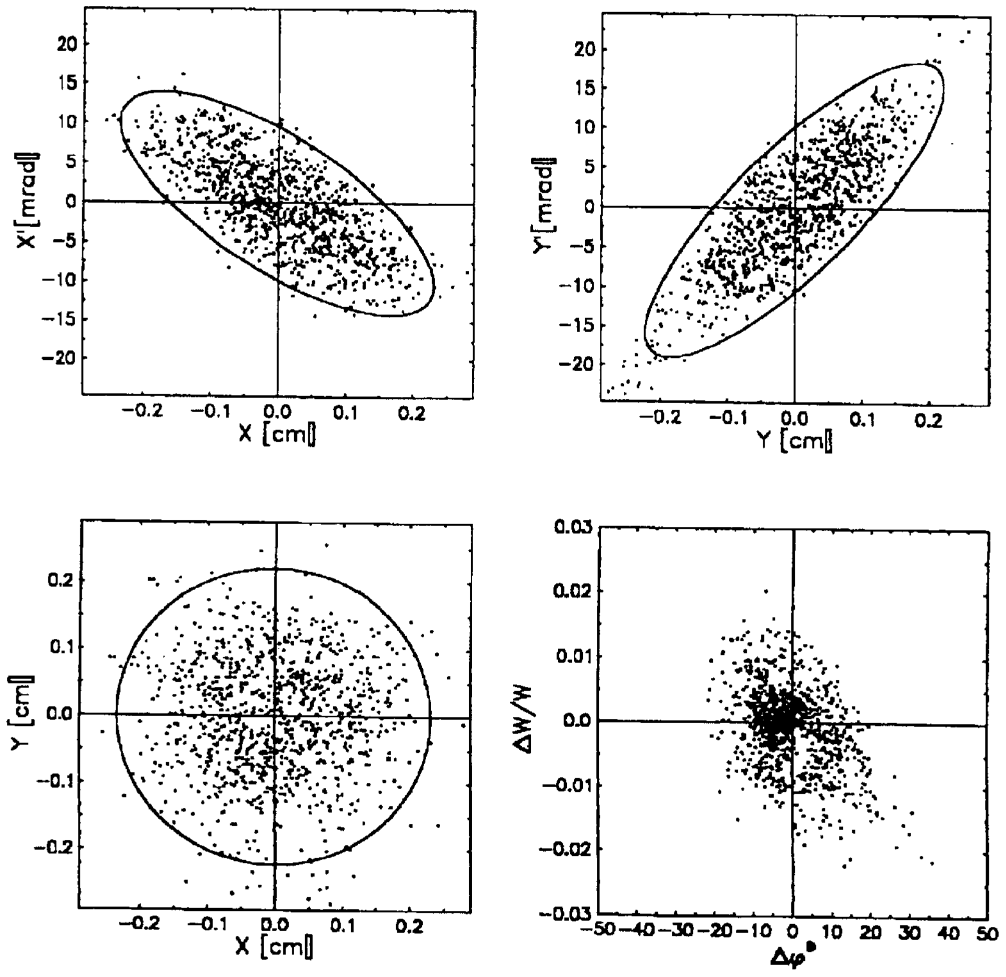
FIG. 6 shows phase space projections of particle distribution at the beginning of the RFQ electrodes.

FIG. 6A shows the projection of the particle distribution at the exit of the RFQ structure in the horizontal phase plane as resulting from beam dynamics simulations.

FIG. 6B shows the projection of the particle distribution at the exit of the RFQ structure in the vertical phase plane as resulting from beam dynamics simulations.

FIG. 6C shows the projection of the particle distribution at the exit of the RFQ structure in the x-y plane as resulting from beam dynamics simulations.

FIG. 6D shows the projection of the particle distribution at the exit of the RFQ structure in the longitudinal phase plane as resulting from beam dynamics simulations.

Due to the advantage of the present invention in that the aperture of the RFQ is increased towards the end of the structure the maximum beam angle is kept below about 20 degree at the structure exit as required for optimized matching to the IH-DTL.

Due to the advantage of the present invention in that the synchronous phase is increased towards 0 degree towards the end of the structure the beam is defocused in the longitudinal phase plane enhancing the efficiency of the rebunching gaps which follow in a very short distance behind of the end of the electrodes.

FIG. 7A to FIG. 7D show phase space projections of the particle distribution at the entrance of the IH-DTL.

Figure 7:
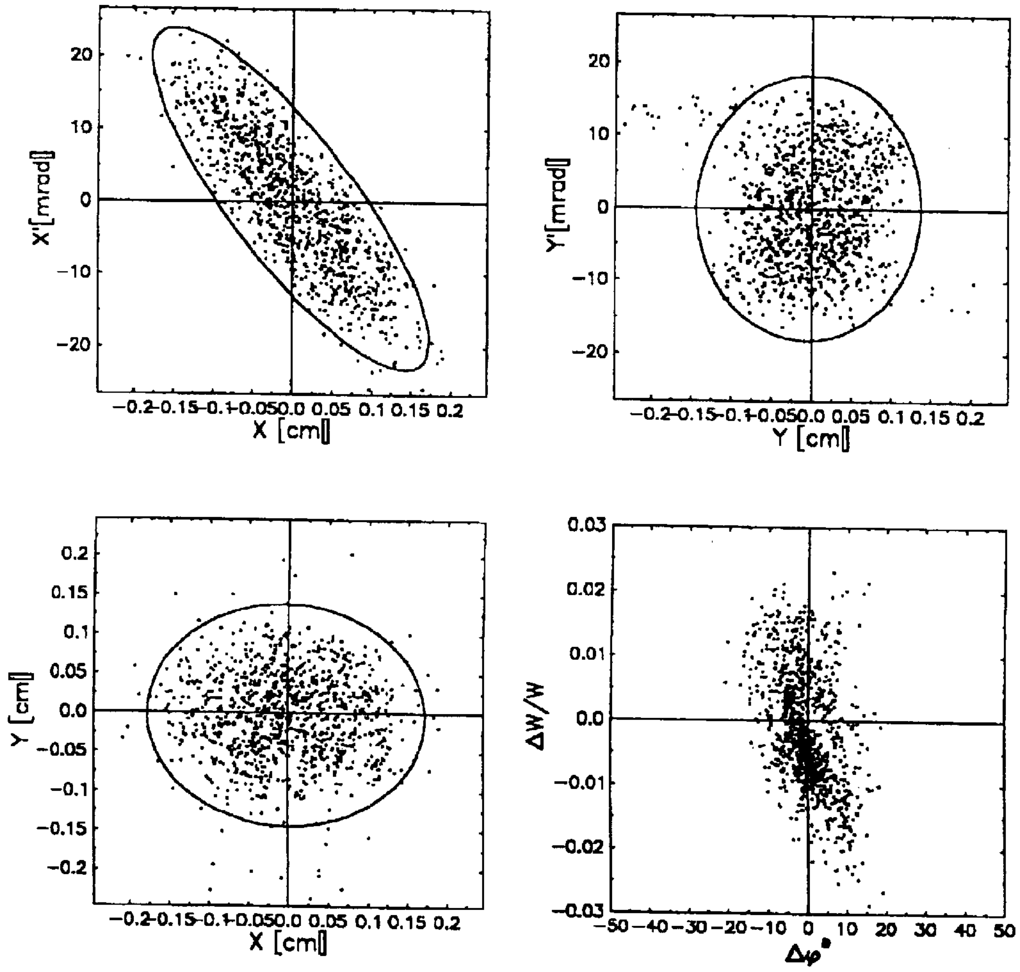
FIG. 7 shows phase space projections of the particle distribution at the entrance of the IH-DTL.

FIG. 7A shows the projection of the particle distribution at the entrance of the IH-DTL in the horizontal phase plane as resulting from beam dynamics simulations of the RFQ and the matching section.

FIG. 7B shows the projection of the particle distribution at the entrance of the IH-DTL in the vertical phase plane as resulting from beam dynamics simulations of the RFQ and the matching section.

FIG. 7C shows the projection of the particle distribution at the entrance of the IH-DTL in the x-y plane as resulting from beam dynamics simulations of the RFQ and the matching section.

FIG. 7D shows the projection of the particle distribution at the entrance of the IH-DTL in the longitudinal phase plane as resulting from beam dynamics simulations of the RFQ and the matching section.

Due to the advantages of the present invention a phase width of the beam at the entrance of the IH-DTL of about ±15 degree is achieved as can be seen from FIG. 7D. Hence, the very compact matching scheme fulfills the requirements of the IH-DTL.

Figure 8:
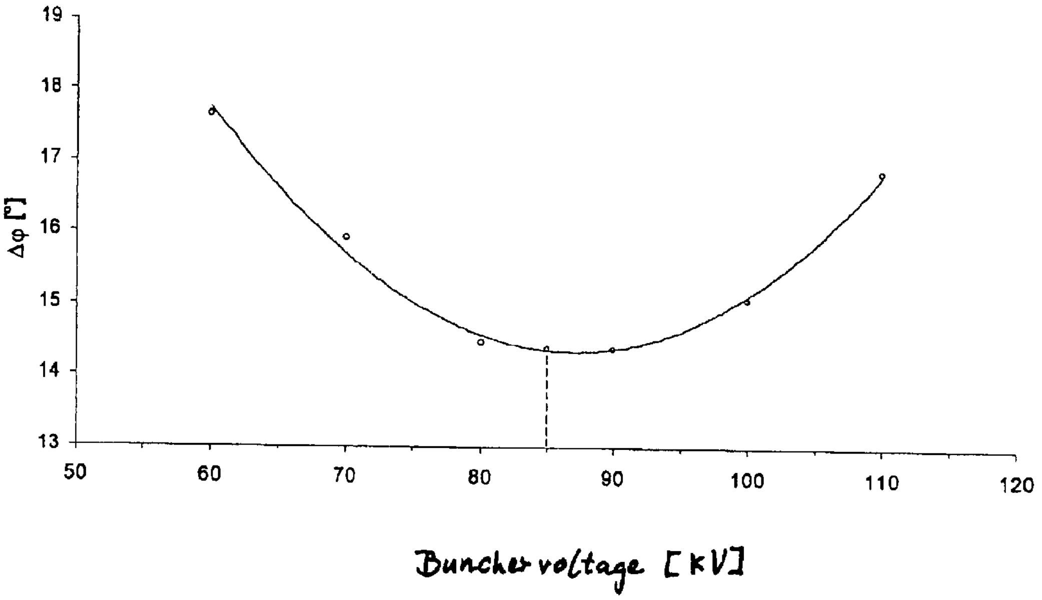
FIG. 8 shows the simulated phase width of the beam at the entrance of the IH-DTL for different total gap voltages in the rebunching gaps integrated into the RFQ.

FIG. 8 shows the simulated phase width of the beam at the entrance of the IH-DTL for different total gap voltages in the rebunching gaps integrated into the RFQ.

A minimum phase width at the entrance of the IH-DTL is achieved with a total gap voltage of about 87 kv. This is about 1.24 times the voltage of the RFQ electrodes (see table 1). Fortunately, the minimum of the curve is very wide and the required phase width can be achieved with total gap voltages between about 75 kV and almost 100 kV.

Figure 9:
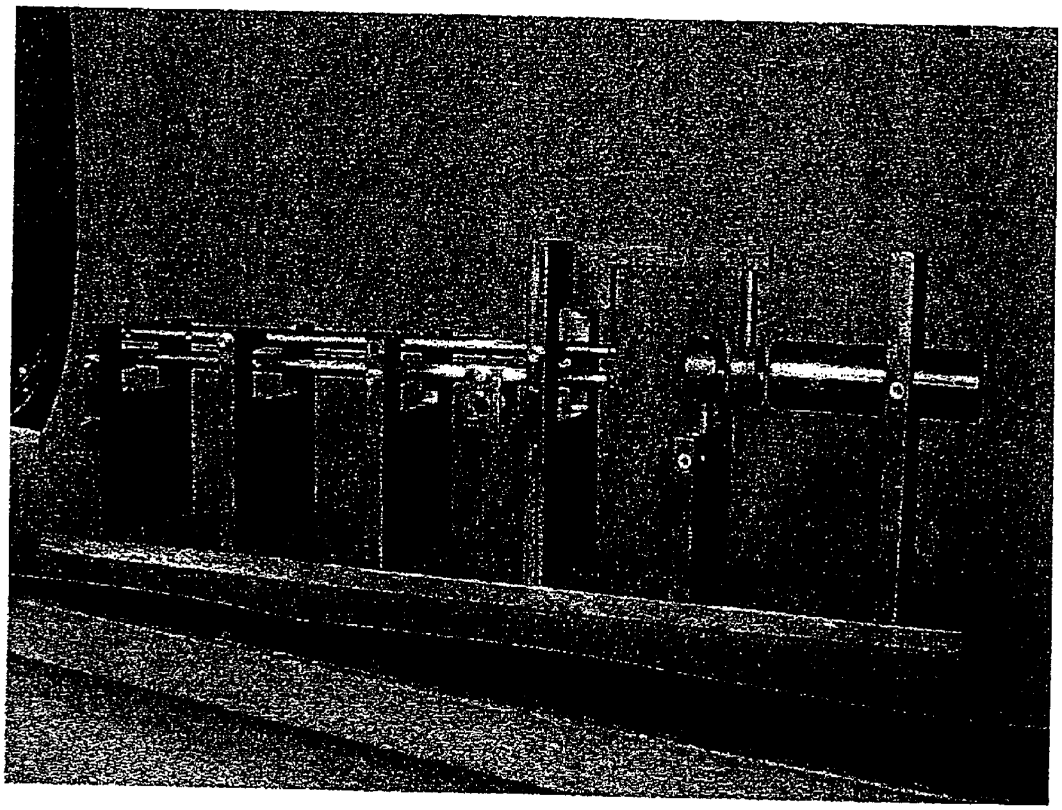
FIG. 9 shows a photograph of an rf model of a part of the RFQ electrodes and the two drift tubes integrated into the RFQ tank.

FIG. 9 shows a photograph of an rf model of a part of the RFQ electrodes and the two drift tubes integrated into the RFQ tank. The model has been used to check the gap voltages which can be achieved by different kinds of mechanics to hold the two tubes and to optimize the geometry. The first drift tube is mounted on an extra stem. This stem is not tuned to the RFQ frequency and is therefore almost on ground potential. The second drift tube is mounted to the last stem of the RFQ structure and is on RF potential therefore. The rf model in FIG. 9 is shown without the tank.

FIG. 10A and FIG. 10B show results of bead-pertubation measurements using said model of FIG. 9.

FIG. 10A shows results of bead-pertubation measurements at the electrodes, measured in a direction transverse to the structure axis.

FIG. 10B shows the results of bead-pertubation measurements along the axis of the drift tube setup.

Bead pertubation measurements have been performed using said model of FIG. 9 to check the gap voltages achieved in the rebunching gaps integrated into the RFQ tank. By comparing the measurements shown in FIG. 10A and FIG. 10B the measured ratio of the total gap voltage to the elctrode voltage amounts to 1.23, which is very close to the optimum of the curve presented in FIG. 8.

Hence, the new concept of this invention of matching the parameters of a beam accelerated by an RFQ to the parameters required by a drift tube linac leads to optimum matching results while using a very compact and much more easy matching scheme as compared to previous solutions.

What is claimed is:

1. An apparatus for pre-acceleration of ion beams and optimized matching of beam parameters used in heavy ion beam application systems, comprising:

a radio frequency quadrupole accelerator (RFQ) having two mini-vane pairs (EL) supported by a plurality of alternating stems (ST) accelerating the ions and wherein said radio frequency quadrupole (RFQ) has an aperture increasing toward the end of its structure and wherein said radio frequency quadrupole (RFQ) has a synchronous phase increasing towards 0 degree towards the end of the structure, a complete intertank matching section for matching the parameters of the ion beams coming from the radio frequency quadrupole accelerator (RFQ) to the parameters required by a subsequent drift tube linear accelerator (DTL).

2. An apparatus for pre-acceleration of ion beams and optimized matching of beam parameters used in heavy ion beam application systems, comprising:

a radio frequency quadrupole accelerator (RFQ) having two mini-vane pairs (EL) supported by a plurality of alternating stems (ST) accelerating the ions, wherein said radio frequency quadrupole (RFQ) has a synchronous phase increasing towards 0 degree towards the end of the structure, a complete intertank matching section for matching the parameters of the ion beams coming from the radio frequency quadrupole accelerator (RFQ) to the parameters required by a subsequent drift tube linear accelerator (DTL), two rebuncher drift tubes positioned at the exit of the radio frequency quadrupole (RFQ) and being integrated into the radio frequency quadrupole (RFQ) tank.

3. The apparatus according to claim 1, wherein said radio frequency quadrupole accelerator accelerates the ions from about 8 keV/u to about 400 keV/u.

4. The apparatus according to claim 1, wherein the alternating stems (ST) are mounted on a common water cooled base plate (BP) within the RFQ.

5. The apparatus according to claim 1, wherein said stems (ST) are acting as inductivity and said mini-vane pair forming electrodes (EL) are acting as capacitance for λ/2 resonance structure.

6. The apparatus according to claim 1, wherein said radio frequency quadrupole (RFQ) is operated at the same frequency as a downstream positioned IH-drift tube linac (DTL).

7. The apparatus according to claim 1, wherein said intertank matching section comprises an xy-steerer magnet downstream of said RFQ.

8. The apparatus according to claim 1, wherein said intertank matching section comprises a quadrupole-doublet.

9. The apparatus according to claim 1, wherein said intertank matching section comprises a diagnostic chamber enclosing a capacitive phase probe and/or a beam transformer positioned at the end of the intertank matching section.

10. The apparatus according to claim 2, wherein said radio frequency quadrupole accelerator accelerates the ions from about 8 keV/u to about 400 keV/u.

11. The apparatus according to claim 2, wherein the alternating stems (ST) are mounted on a common water cooled base plate (BP) within the RFQ.

12. The apparatus according to claim 2, wherein said stems (ST) are acting as inductivity and said mini-vane pair forming electrodes (EL) are acting as capacitance for λ/2 resonance structure.

13. The apparatus according to claim 2, wherein said radio frequency quadrupole (RFQ) is operated at the same frequency as a downstream positioned IH-drift tube linac (DTL).

14. The apparatus according to claim 2, wherein said intertank matching section comprises an xy-steerer magnet downstream of said RFQ.

15. The apparatus according to claim 2, wherein said intertank matching section comprises a quadrupole-doublet.

16. The apparatus according to claim 2, wherein said intertank matching section comprises a diagnostic chamber enclosing a capacitive phase probe and/or a beam transformer positioned at the end of the intertank matching section.

* * * * *